United States Patent
Quinn et al.

(10) Patent No.: US 9,303,319 B2
(45) Date of Patent: Apr. 5, 2016

(54) GAS INJECTION SYSTEM FOR CHEMICAL VAPOR DEPOSITION USING SEQUENCED VALVES

(75) Inventors: William E. Quinn, Whitehouse Station, NJ (US); Eric A. Armour, Pennington, NJ (US)

(73) Assignee: Veeco Instruments Inc., Plainview, NY (US)

( * ) Notice: Subject to any disclaimer, the term of this patent is extended or adjusted under 35 U.S.C. 154(b) by 12 days.

(21) Appl. No.: 12/972,270

(22) Filed: Dec. 17, 2010

(65) Prior Publication Data

US 2012/0156363 A1    Jun. 21, 2012

(51) Int. Cl.
*C23C 16/455*  (2006.01)
*C23C 16/52*   (2006.01)

(52) U.S. Cl.
CPC ..... *C23C 16/45574* (2013.01); *C23C 16/45561* (2013.01); *C23C 16/52* (2013.01)

(58) Field of Classification Search
CPC .................. C23C 16/45574; C23C 16/45557; C23C 16/45561
See application file for complete search history.

(56) References Cited

U.S. PATENT DOCUMENTS

| | | | |
|---|---|---|---|
| 4,010,045 A | | 3/1977 | Ruehrwein |
| 4,369,031 A | * | 1/1983 | Goldman et al. ............ 432/198 |
| 4,741,354 A | * | 5/1988 | DeMild, Jr. ................. 137/240 |
| 4,980,204 A | | 12/1990 | Fuji et al. |
| 4,993,358 A | | 2/1991 | Mahawili |
| 5,091,320 A | * | 2/1992 | Aspnes et al. ................. 427/8 |
| 5,106,453 A | | 4/1992 | Benko et al. |
| 5,269,847 A | | 12/1993 | Anderson |
| 5,393,232 A | | 2/1995 | Haines |

(Continued)

FOREIGN PATENT DOCUMENTS

| | | |
|---|---|---|
| EP | 0339845 B1 | 11/1989 |
| EP | 0339845 B1 * | 1/1993 |

(Continued)

OTHER PUBLICATIONS

"Notification of Transmittal of The International Search Report and the Written Opinion of The International Searching Authority, or The Declaration" for PCT/US2011/057227, Apr. 18, 2012, 10 pages, The International Searching Authority/KR, Korean Intellectual Property Office, Seo-gu, Daejeon, Republic of Korea.

(Continued)

*Primary Examiner* — Jeffrie R Lund
*Assistant Examiner* — Yuechuan Yu
(74) *Attorney, Agent, or Firm* — Kurt Rauschenbach; Rauschenbach Patent Law Group, LLC

(57) ABSTRACT

A gas injection system for a chemical vapor deposition system includes a gas manifold comprising a plurality of valves where each of the plurality of valves has an input that is coupled to a process gas source and an output for providing process gas. Each of a plurality of gas injectors has an input that is coupled to the output of one of the plurality of valves and an output that is positioned in one of a plurality of zones in a chemical vapor deposition reactor. A controller having a plurality of outputs where each of the plurality of outputs is coupled to a control input of one of the plurality of valves. The controller instructs at least some of the plurality of valves to open at predetermined times to provide a desired gas flow to each of the plurality of zones in the chemical vapor deposition reactor.

17 Claims, 3 Drawing Sheets

(56) References Cited

U.S. PATENT DOCUMENTS

| | | | |
|---|---|---|---|
| 5,431,738 | A | 7/1995 | Murakami et al. |
| 5,843,234 | A | 12/1998 | Finn et al. |
| 5,853,484 | A * | 12/1998 | Jeong ............................ 118/715 |
| 5,956,148 | A | 9/1999 | Celii |
| 6,197,121 | B1 | 3/2001 | Gurary et al. |
| 6,280,581 | B1 | 8/2001 | Cheng |
| 6,289,842 | B1 | 9/2001 | Tompa |
| 6,333,272 | B1 | 12/2001 | McMillin et al. |
| 6,428,850 | B1 | 8/2002 | Shinriki et al. |
| 6,448,536 | B2 | 9/2002 | Li et al. |
| 6,480,286 | B1 | 11/2002 | Kubo et al. |
| 6,499,425 | B1 | 12/2002 | Sandhu et al. |
| 6,511,539 | B1 | 1/2003 | Raajimakers |
| 6,887,523 | B2 | 5/2005 | Zhuang et al. |
| 7,524,532 | B2 | 4/2009 | Jurgensen et al. |
| 2002/0009868 | A1 | 1/2002 | Tobashi et al. |
| 2002/0076490 | A1* | 6/2002 | Chiang et al. ............. 427/248.1 |
| 2002/0142493 | A1* | 10/2002 | Halliyal et al. ................. 438/14 |
| 2003/0056728 | A1 | 3/2003 | Lindner et al. |
| 2003/0091740 | A1 | 5/2003 | Gilbert et al. |
| 2003/0207032 | A1 | 11/2003 | Ahn et al. |
| 2006/0021574 | A1* | 2/2006 | Armour et al. ................ 118/715 |
| 2006/0121193 | A1 | 6/2006 | Strauch et al. |
| 2007/0071896 | A1* | 3/2007 | Murphy et al. ............ 427/255.5 |
| 2007/0134419 | A1 | 6/2007 | Mitrovic et al. |
| 2009/0017190 | A1* | 1/2009 | Sferlazzo et al. ............... 427/10 |
| 2009/0064932 | A1 | 3/2009 | Kim et al. |
| 2009/0236447 | A1 | 9/2009 | Panagopoulos et al. |
| 2010/0012034 | A1 | 1/2010 | Strauch et al. |
| 2012/0156363 | A1 | 6/2012 | Quinn et al. |

FOREIGN PATENT DOCUMENTS

| | | | |
|---|---|---|---|
| JP | 1-047017 | A | 2/1989 |
| JP | 1-140712 | A | 6/1989 |
| JP | 2-096324 | A | 4/1990 |
| JP | 02187018 | A * | 7/1990 |
| JP | 03262116 | A * | 11/1991 |
| JP | 4-364024 | A | 12/1992 |
| JP | 08-261648 | | 10/1996 |
| JP | 08261648 | A * | 10/1996 |
| JP | 2000-091320 | A | 3/2000 |
| JP | 2000286251 | A | 10/2000 |
| JP | 2001-351864 | A | 12/2001 |
| JP | 2002-155366 | A | 5/2002 |
| KR | 1020000069146 | A1 | 11/2000 |
| KR | 1020020084102 | A1 | 11/2002 |
| TW | I261310 | B | 9/2006 |
| WO | 9823788 | A1 | 6/1998 |
| WO | 2006 020424 | A2 | 2/2006 |
| WO | 2006020424 | A2 | 2/2006 |

OTHER PUBLICATIONS

Office Action for U.S. Appl. No. 11/544,075 dated Mar. 24, 2010, The USPTO.
Office Action for Japanese Application 2005-508277 dated Jun. 19, 2009.
Translation of Decision from Taiwanese Application No. 096136935 dated Apr. 23, 2012 citing Citation 1 (TW 200511394) which corresponds to TWI261310 and US 20070071896, already cited.
Translation of Office Action from Taiwanese Application No. 096136935 dated Aug. 10, 2011 citing Citation 1 (TW 200511394) which corresponds to TWI261310 and US 20070071896, already cited.
Search Report from Taiwanese Application No. 096136935 dated Aug. 12, 2011.
Office Action for European Application 03818356.2 dated May 13, 2011, European Patent Office.
Office Action for European Application 03818356.2 dated Apr. 1, 2010, European Patent Office.
Supplementary European Search Report for European Application 03818356.2 dated May 8, 2009, European Patent Office.
Office Action for Chinese Application 03826932.5 dated Nov. 7, 2008, The Patent Office of The State Intellectual Property Office of The People's Republic of China.
Office Action for U.S. Appl. No. 10/568,794 dated Aug. 18, 2010, The USPTO.
Office Action for U.S. Appl. No. 10/568,794 dated Mar. 22, 2011, The USPTO.
Office Action for U.S. Appl. No. 10/568,794 dated Nov. 28, 2012, The USPTO.
Office Action for U.S. Appl. No. 11/544,075 dated Sep. 27, 2010, The USPTO.
Office Action for Korean Application 10-2011-7022213 dated Dec. 20, 2011.
International Preliminary Report on Patentability for Application PCT/US2011/057227, Jun. 18, 2013, 6 pages, The International Bureau of WIPO, Geneva Switzerland.
Notification Concerning Transmittal of Copy of International Preliminary Report on Patentability for Application PCT/US2011/057227, Jun. 27, 2013, 1, Geneva Switzerland.
"Office Action" for Korean Patent Application No. 10-2009-7009061, May 1, 2013, Korean Intellectual Property Office, Seoul Korea.
Decision of Rejection for Japanese Patent Application No. 2010-153158, Apr. 19, 2013, Japan Patent Office, Japan.
"Office Action" for U.S. Appl. No. 10/568,794, Jun. 21, 2013, 18 pages, USPTO.
Breiland, W.; Evans, G.; "Design and Verification of Nearly Ideal Flow and Heat Transfer in a Rotating Disk Chemical Vapor Deposition Reactor," J. Electrochem, Soc., vol. 138, No. 6, Jun. 1991.
"Office Action" for Korean Patent Application No. 10-2009-7009061, Korean Intellectual Property Office, Seoul Korea.
"Office Action" for U.S. Appl. No. 11/544,075, filed Oct. 6, 2006; 30 Pages.

* cited by examiner

GAS INJECTION SYSTEM FOR CHEMICAL VAPOR DEPOSITION USING SEQUENCED VALVES

The section headings used herein are for organizational purposes only and should not to be construed as limiting the subject matter described in the present application in any way.

INTRODUCTION

Chemical vapor deposition involves directing one or more gases containing chemical species onto a surface of a substrate so that the reactive species react and form a film on the surface of the substrate. For example, CVD can be used to grow compound semiconductor material on a crystalline semiconductor substrate. Compound semiconductors, such as III-V semiconductors, are commonly formed by growing various layers of semiconductor materials on a substrate using a source of a Group III metal and a source of a Group V element. In one CVD process, sometimes referred to as a chloride process, the Group III metal is provided as a volatile halide of the metal, which is most commonly a chloride, such as $GaCl_3$, and the Group V element is provided as a hydride of the Group V element.

One type of CVD is known as metal organic chemical vapor deposition (MOCVD), which is sometimes called organometallic vapor-phase epitaxy (OMVPE). MOCVD uses chemical species that include one or more metal-organic compounds, such as alkyls of the Group III metals, such as gallium, indium, and aluminum. MOCVD also uses chemical species that include hydrides of one or more of the Group V elements, such as $NH_3$, $AsH_3$, $PH_3$ and hydrides of antimony. In these processes, the gases are reacted with one another at the surface of a substrate, such as a substrate of sapphire, Si, GaAs, InP, InAs or GaP, to form a III-V compound of the general formula $In_XGa_YAl_ZN_AAs_BP_CSb_D$, where X+Y+Z equals approximately one, and A+B+C+D equals approximately one, and each of X, Y, Z, A, B, and C can be between zero and one. In some instances, bismuth may be used in place of some or all of the other Group III metals.

Another type of CVD is known as Halide Vapor Phase Epitaxy (also known as HVPE). HVPE processes are used to deposit Group III nitrides (e.g., GaN, AlN, AlN, and AlGaN) and other semiconductors (e.g. GaAs, InP and their related compounds). These materials are formed with Group III elements arranged as metals and supplied to a substrate through a hydrogen halide. The hot gaseous metal chlorides (e.g., GaCl or AlCl) are reacted with ammonia gas ($NH_3$) or hydrogen. The metal chlorides are generated by passing hot HCl gas over the hot Group III metals. All reactions are done in a temperature controlled quartz furnace. One feature of HVPE is that it can have a very high growth rate, that is up to or greater than 100 μm per hour for some state-of-the-art processes. Another feature of HVPE is that it can be used to deposit relatively high quality films because films are grown in a carbon-free environment and because the hot HCl gas provides a self-cleaning effect.

Rotating disk reactors are commonly used for CVD processing. Rotating disk reactors inject one or more gases onto the surface of a rotating substrate to grow epitaxial layers thereon. One type of rotating disk reactor is a vertical high-speed rotating disk reactor. The gas or gases in these reactors are injected downwardly onto a surface of a substrate that is rotating within the reactor. Vertical high-speed rotating disk reactors are frequently used for CVD and MOCVD growth. These reactors have been used for growing a wide variety of epitaxial compounds, including various combinations of semiconductor single films and multilayered structures such as lasers and LED'S.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicants' teaching in any way.

DESCRIPTION OF VARIOUS EMBODIMENTS

Figure 1:
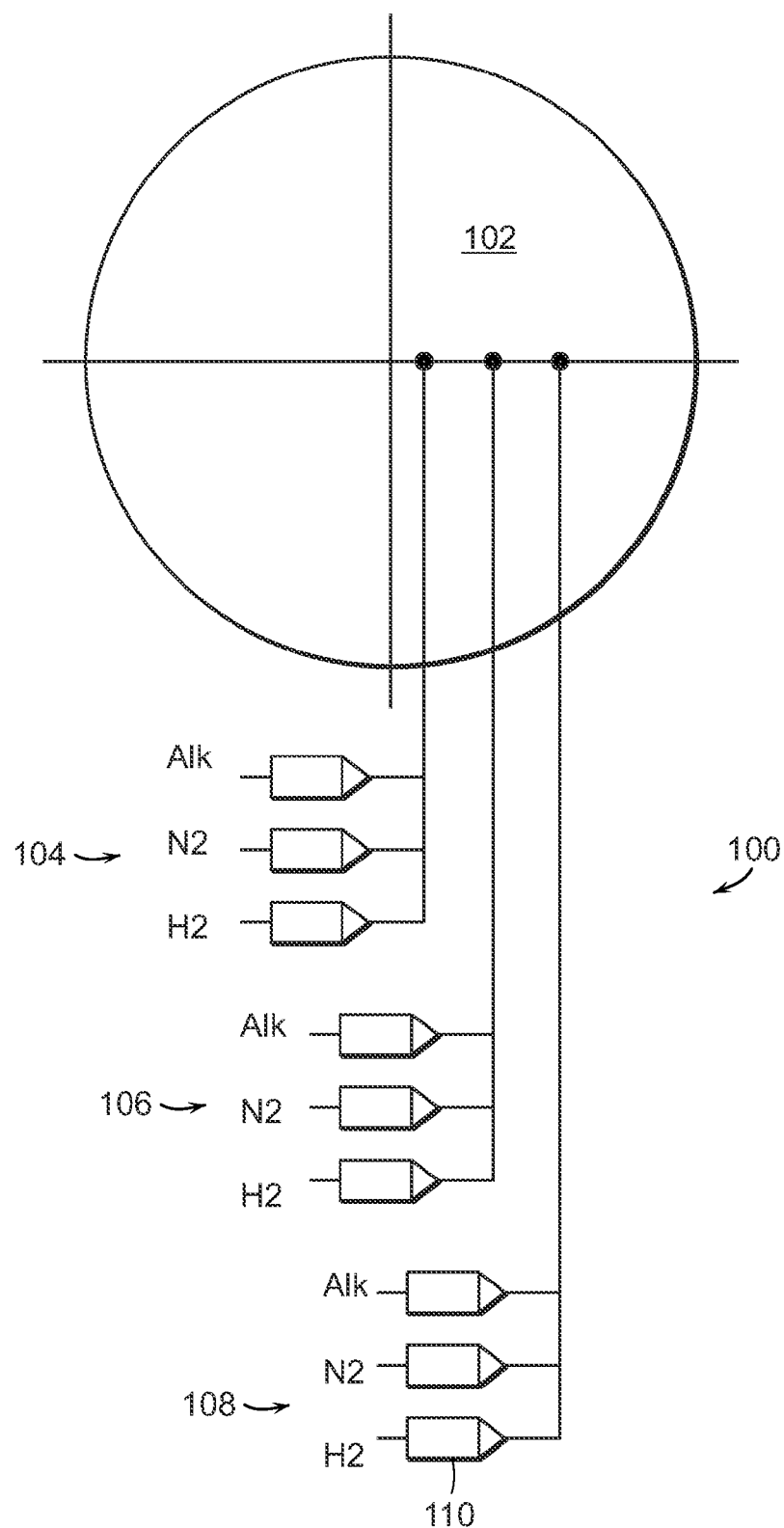
FIG. 1 illustrates a schematic diagram of a multi-zone alkyls injection system for an MOCVD rotating disc reactor that adjusts the reactant gas flow of each zone individually.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings may be performed in any order and/or simultaneously as long as the teaching remains operable. Furthermore, it should be understood that the apparatus and methods of the present teachings can include any number or all of the described embodiments as long as the teaching remains operable.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to a gas injection system for CVD systems, such as rotating disc reactors. One skilled in the art will appreciate that the methods and apparatus of the present invention can be applied to any type of CVD system and are not limited to only rotating disk reactors. In vertical high-speed rotating disk reactors, one or more injectors are spaced above a substrate or workpiece carrier to provide a predetermined gas flow, which upon contact with the substrate, deposits layers of epitaxial material on the surface of the substrate. Such, rotating disk reactors for growing epitaxial material on larger wafers typically include several injectors spaced above the substrate. The injectors are usually spaced above the substrate in various positions along one or more radial axes of the substrate, relative to the central axis of the substrate carrier.

Growth uniformity is achieved only if growth parameters are linearly distributed across the reactor. The gas injectors can be designed to provide a uniform reactant gas distribution across the reactor. In some rotating disk reactors, the rate of source reactant material injected into the reactor varies from injector to injector. Some reactant injectors may be designed and operated to provide different gas flow velocities than other reactant injectors in order to achieve a uniform molar quantity of reactant material along the surface of the substrate. This variation in reactant flow rate/velocity is necessary in order to achieve a uniform molar quantity of reactant material along the entire surface of the substrate. The variation in reactant flow rate/velocity is necessary because of the relative placement of the reactant injectors. In particular, the injectors near the outer edge of the carrier inject gas over a larger surface area on the carrier than the injectors closer to the center of the carrier in any given time period. Consequently, the outer injectors typically are designed and operated to have a greater reactant gas flow rate than the inner injectors in order to maintain the desired uniformity. In some rotating disk reactors, the reactant gas flow rates of the outer most injectors are adjusted to be as much as a factor of three to four higher than the reactant gas flow rates of the inner most injectors.

In multi-zone alkyls injector systems, the deposition uniformity is provided by adjusting the alkyls gas flow for each zone individual flow. FIG. 1 illustrates a schematic diagram of a multi-zone alkyls injection system 100 for an MOCVD rotating disc reactor 102 that adjusts the reactant gas flow of each zone individually. The injection system 100 is shown with three separate zones 104, 106, and 108 positioned in a radial direction. Each of the three separate zones 104, 106, and 108 includes separate Alkyls, and two push flow gas mass flow controllers 110. In the example shown, nitrogen and hydrogen push flow gases are used to control the flow dynamics. The use of three separate mass flow controllers for each zone significantly limits the number of zones that can be employed in a practical system to a relatively small number.

Optimizing the uniformity of the multi-zone alkyls injection system 100 requires performing separate deposition runs for each of the zones because the individual response from the each zone is different and is strongly dependent on the process conditions. Optimizing different process conditions typically requires having different zone sizes. However, the zone sizes are typically fixed and are not adjustable. Consequently, multi-zone Alkyls injectors with a limited number of zones may not provide for the best possible deposition uniformity under all process conditions.

The multi-zone alkyls injection system of the present teaching uses an alkyls gas source including a mass flow controller having an output that is coupled to a gas manifold comprising a plurality of valves. Each of the plurality of valves has an output that provides alkyls process gas to one of a plurality of gas injectors that is positioned in one of a plurality of zones in a CVD reactor. There are many possible configurations according to the present teaching. In one configuration, a single mass flow controller having an input coupled to an alkyls process gas source is used to provide alkyls process gas to a gas manifold that provides alkyls process gas to the entire CVD reactor. However, in other embodiments, two or more mass flow controllers having inputs coupled to one or more alkyls process gas sources have outputs that are coupled to two or more gas manifolds that provides alkyls process gas to the CVD reactor.

In addition, in some gas injection systems according to the present teaching, a single mass flow controller is used to provide a push flow gas to each of the plurality of zones in the CVD reactor to control the gas flow dynamics. In some gas injection systems, a gas manifold comprising a plurality of valves is coupled to the output of the single mass flow controller. Each of the plurality of valves has an output that provides push flow gas to one of a plurality of gas injectors that is positioned in one of a plurality of zones in a CVD reactor.

Figure 2:
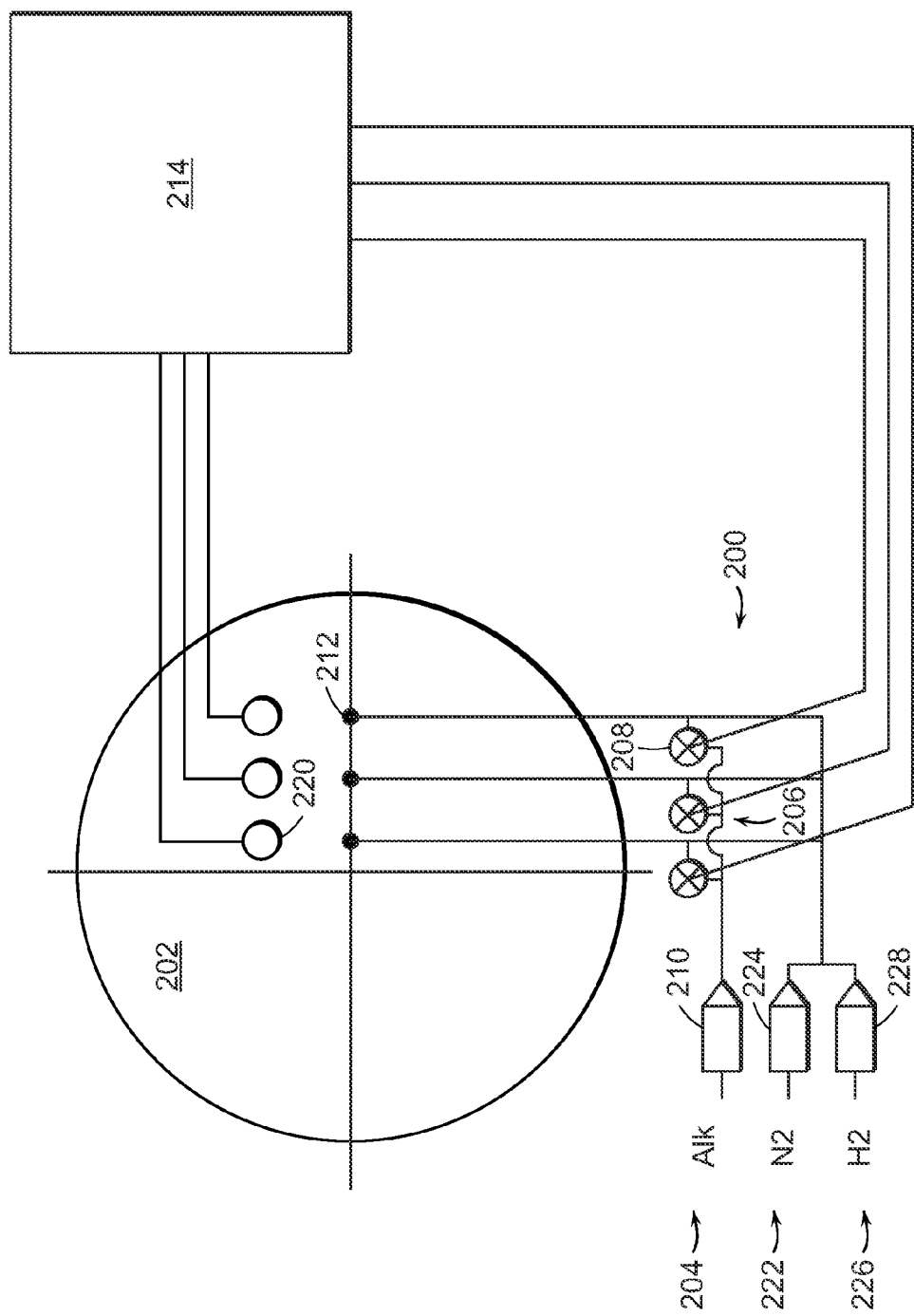
FIG. 2 illustrates a schematic diagram of a multi-zone alkyls injection system according to the present invention for a CVD rotating disc reactor that includes a single alkyls gas source coupled to a gas manifold comprising a plurality of valves.

FIG. 2 illustrates a schematic diagram of a multi-zone alkyls injection system 200 according to the present invention for a CVD rotating disc reactor 202 that includes a single alkyls gas source 204 coupled to a gas manifold 206 comprising a plurality of valves 208. Many aspects of the present teaching are described in connection with a rotating disk reactor. However, it should be understood that the methods and apparatus of the present teachings can be applied to any type of CVD reactor. A mass flow controller 210 is coupled between the alkyls gas source 204 and the gas manifold 206 to provide precise control over the alkyls gas flow to the gas manifold 206. In some embodiments of the present teaching, mass flow controllers are also positioned at one or more of the outputs of the gas manifold 206 to provide a precise flow of alkyls and/or push flow gases to individual gas injectors 212.

In various embodiments, at least some of the plurality of valves 208 in the gas manifold 206 are independently controllable. For example, the plurality of valves 208 can be electrically controllable or pneumatically controllable. However, in some systems, at least one of the plurality of valves 208 is partially or fully open during the entire duration of the process run. Using electrically and/or pneumatically controllable valves that provide gas to corresponding zones can significantly increase the number of zones which can be practically used without increasing the overall gas injection system cost and complexity. One skilled in the art will appreciate that numerous types of valves can be used. For example, at least some of the plurality of valves 208 in the gas manifold 206 can be MEMS type valves. MEMS type valves can have very fast response times that can result in very precise control of the gas flow.

A plurality of gas injectors 212 are coupled to each of the plurality of valves 208 comprising the gas manifold 206. Each of the plurality of gas injectors 212 has an input that is coupled to the output of a corresponding one of the plurality of valves 208. In some CVD reactors, at least some of the plurality of the injectors 212 are concentrically positioned in the CVD reactor. An output of each of the plurality of gas injectors 212 is positioned in one of a plurality of zones in the CVD reactor 202. In various embodiments, the diameter of orifices comprising the output of each of the plurality of gas injectors 212 can be the same or can be different depending upon the position of the gas injector 212 in the CVD reactor 202.

In some embodiments, at least one of the plurality of gas injectors 212 is movable. For example, see U.S. patent application Ser. No. 11/827,133, entitled "Movable Injectors in Rotating Disc Gas Reactors." The entire disclosure of U.S. patent application Ser. No. 11/827,133 is incorporated herein by reference. In these embodiments, the gas injectors can be adjustable to configure the reactor prior to processing so that the CVD reactor 202 has certain predetermined gas flow dynamics during processing. In other embodiments, at least some of the plurality of gas injectors can be movable during processing.

A controller 214 or processor is used to electrically or pneumatically open and close some or all of the plurality of valves 208 for a predetermined time period and with a predetermined duty cycle. The controller 214 has a plurality of outputs where each of the plurality of outputs is coupled to a control input of one of the plurality of valves 208. The controller 214 generates control signals that instruct at least some of the plurality of valves 208 to open at predetermined times and with a predetermined duty cycle to provide a desired gas flow to each of the plurality of zones in the rotating disc CVD reactor 202. In various embodiments, the control signals can directly control the plurality of valves 208 or can operate electronically controllable pneumatic valves that control the operation of the plurality of valves 208.

There are numerous possible valve timing sequences that can be used for controlling the opening of the plurality of valves 208. For example, the plurality of valves 208 can be opened for a time period and a duty cycle that is equivalent to an integer multiple of the radial rotation rate of the rotating disc CVD reactor 202. Also, the plurality of valves 208 can be opened for a time period and a duty cycle which enables all wafers at a certain radial position on the rotating disk CVD reactor 202 to have an equivalent film thickness. In some embodiments, at least one of the time period and the duty cycle that the plurality of valves 208 is open is a function of the rotation rate of the rotating disk CVD reactor 202. In some systems, it has been determined that a rotation rate of the rotating disk CVD reactor 202 that is greater than about 120 rpms enhances film uniformity.

For example, in some methods, the controller 214 generates control signals having duty cycles for opening at least one of the plurality of valves 208 that are proportional to the radius squared of the aperture of the respective gas injector 212. In other methods, the controller 214 generates control signals having duty cycles for opening at least one of the plurality of valves 208 that is longer than 1 radial rotation of the disc in the rotating disc CVD reactor 202. In these methods, the duty cycle of the control signals that open the valves 208 and the diameter of the aperture of the gas injectors 212 are chosen to provide a predetermined amount of gas to a particular zone in the rotating disc CVD reactor 202.

Some CVD systems according to the present teaching include one or more in-situ deposition rate monitors that measure at least one of deposition rate and deposited film thickness in at least one of the plurality of zones in the rotating disc CVD reactor 202. In many systems, an in-situ deposition rate monitor 220 measures at least one of deposition rate and deposited film thickness in each of the plurality of zones in the rotating disc CVD reactor 202. An output of each of the in-situ deposition rate monitors 220 is electrically connected to one of a plurality of sensor inputs of the controller 214. The controller 214 processes the data from the in-situ deposition rate monitors 220 and generates control signals in response to the data that control the timing and duty cycle for opening at least some of the plurality of valves 208 in response to the in-situ growth deposition rate monitor measurements.

In addition, a nitrogen push gas source 222 is coupled to a single mass flow controller 224. The output of the mass flow controller 224 is coupled to the gas injectors 212 in each of the plurality of zones. Similarly, a hydrogen push gas source 226 is coupled to a single mass flow controller 228. The output of the mass flow controller 228 is coupled to gas injectors 212 in each of the plurality of zones. In various embodiments, one or both of the nitrogen and hydrogen push gas sources 222, 226 can be coupled to more than one mass flow controller so that different zones can receive different volumes of push gas. Also, in various embodiments, the outputs of one or both of the nitrogen and hydrogen push gas mass flow controllers 224, 228 can be coupled to a gas manifold comprising a plurality of valves. In these embodiments, each of the plurality of valves of the gas manifold has an output that provides push flow gas to one of a plurality of gas injectors 212 positioned in one of a plurality of zones in the rotating disc CVD reactor 202.

A method of gas injection into a CVD system according to the present teaching includes providing a process gas to inputs of a plurality of valves 208 and then providing the process gas from outputs of the plurality of valves 208 to a plurality of gas injectors 212 positioned in a plurality of zones in a CVD reactor 202. The method applies to all types of CVD reactors, such as rotating disc-type CVD reactors. The method is particular useful for alkyl gas injection because the method can be used to provide precise amounts of alkyl gas to particular areas of a CVD reactor while using only a single mass flow controller.

A controller 214 or processor determines the desired timing and duty cycles for opening each of the plurality of valves 208 in order to provide a desired amount of process gas to each of the plurality of zones in the CVD reactor 202. Each of the plurality of valves 208 is then opened for its desired duty cycle, which provides the desired amount of process gas to each of the plurality of zones in the CVD reactor 202 for deposition. In various embodiments, some or all of the plurality of valves 208 are opened sequentially. Also, in various embodiments, some of plurality of valves are continuously open during deposition.

In one method according to the present teaching, the duty cycle for opening the plurality of valves 208 in the gas manifold 206 of the rotating disk CVD reactor 202 is inversely proportional to a radius of the corresponding one of the plurality of zones. In this method, the gas provided by some or all of the plurality of gas injectors 212 is determined by the radial position of the gas injector 212 in the rotating disk reactor 202. Gas injectors 208 that are positioned closer to the outer diameter of the rotating disk reactor 202 will provide a greater volume of gas compared with gas injectors 212 closer to the center of the rotating disk reactor 202.

In some methods, at least one of growth rate and deposited film thickness is measured during deposition. For example, growth rate and/or deposited film thickness can be measured across the plurality of zones in a radial direction. Numerous methods can be used to measure growth rate and/or deposited film thickness. For example, in-situ reflection measurements can be used to measure both growth rate and overall deposited film thickness. These growth rate and/or deposited film thickness measurements can be performed in any number of locations across the CVD reactor 202 during deposition. For example, the growth rate and/or deposited film thickness measurements can be performed in at least two of a plurality of zones of the CVD reactor 202 during deposition.

The resulting in-situ measurements can be used to adjust the timing and/or duty cycle for opening at least one of the plurality of valves 208 in response to the measurements. These methods of in-situ growth rate and/or deposited film thickness can be used to provide feedback to the mass flow controllers 210, 224, and 228 for adjusting the gas flow dynamics in the CVD reactor 202 so as to improve the uniformity of the deposited films. In addition, these methods of in-situ growth rate and/or deposited film thickness can be used to provide feedback to the mass flow controllers 210, 224, and 228 to adjust the gas flow dynamics in the CVD reactor 202 so that a precise deposited film thickness can be achieved.

These methods of in-situ growth rate and/or deposited film thickness can also be used to change a dimension of an orifice of one or more of the plurality of gas injectors 212 in one or more zones of the CVD reactor 202 in response to at least one deposition metric. Some deposition metrics include growth rate, deposited film thickness, and deposited film uniformity. Furthermore, these methods of in-situ growth rate and/or deposited film thickness can be used to change the position of one or more movable gas injectors in one or more of the plurality of zones of the CVD reactor 202 in response to at least one deposition metric. In some methods, the gas injectors 212 are moved to particular fixed locations. In other methods, the gas injectors 212 are scanned at a constant speed or at a variable speed during growth. Moving the alkyls injectors provides for a simple and effective method to adjust uniformity.

Also, in some methods, the volume of gas injected by the gas injector 212 is variable during growth. In one particular method, the alkyls gas flow varies to compensate for the "dead zone" that occur during each linear movement where linear speed of the gas injector 212 is equal to zero. In one method where the materials being grown are sensitive to growth rate, the alkyls injectors are moved in a pattern where the positions of some gas injectors are phase shifted relatively other gas injectors.

The gas injection system of the present teaching has numerous modes of operation. One mode of operation is the simultaneous mode. In the simultaneous mode of operation, each of the plurality of valves 208 is open during the entire deposition. The position of the valve opening can be adjusted to change the volume and fluid dynamics of gas injected from the associated gas injector 212 in the CVD reactor 202. However, the adjustment of one valve adjusts the flow available to the other valves. Consequently, it is difficult to control deposition metrics in the simultaneous mode of operation.

Another mode of operation is the sequential mode. In the sequential mode of operation, only one of the plurality of valves 208 connected to the gas manifold 206 is open at each moment of time. It is relatively easy to optimize deposition metrics in the sequential mode of operation because there is no interaction of gasses flowing from different valves in the gas manifold 206 that are injected in the CVD reactor 202 with different gas injectors 212. Consequently, the response characteristics of each of the plurality of valves 208 can be easily determined and used to directly optimize one or more deposition metrics. However, if the properties of the deposited material are a strong function of the deposition rate, then each zone along the wafer carrier can have a significantly different growth rate. Material deposited using the sequential mode of operation generally has the same integrated material properties across the CVD reactor 202, but there are different gradients of the material thickness. In some CVD reactors 202, different alkyls sources with different flow characteristics are used for each zone to compensate for these different gradients of the material thickness.

Another mode of operation is the combined mode of operation. In the combined mode, a first group of alkyls injector operates in the simultaneous mode of operation. In some methods using the combined mode of operation, the bulk of the material growth is performed using the simultaneous mode of operation. For example, 90% or an even higher percentage of the material grown can be performed using the simultaneous mode of operation. Deposition metrics, such as the deposited film uniformity, may be relatively poor for material deposited using the simultaneous mode of operation. A second group of alkyls injector then operates in the sequential mode of operation and provides fine tuning of the deposition thickness and/or other deposition metrics in desired regions of the CVD reactor 202. In some method using this mode of operation, only a small fraction of the material is grown in the sequential mode of operation. For example, in some methods less than 10% of the material is grown using the simultaneous mode of operation.

Figure 3:
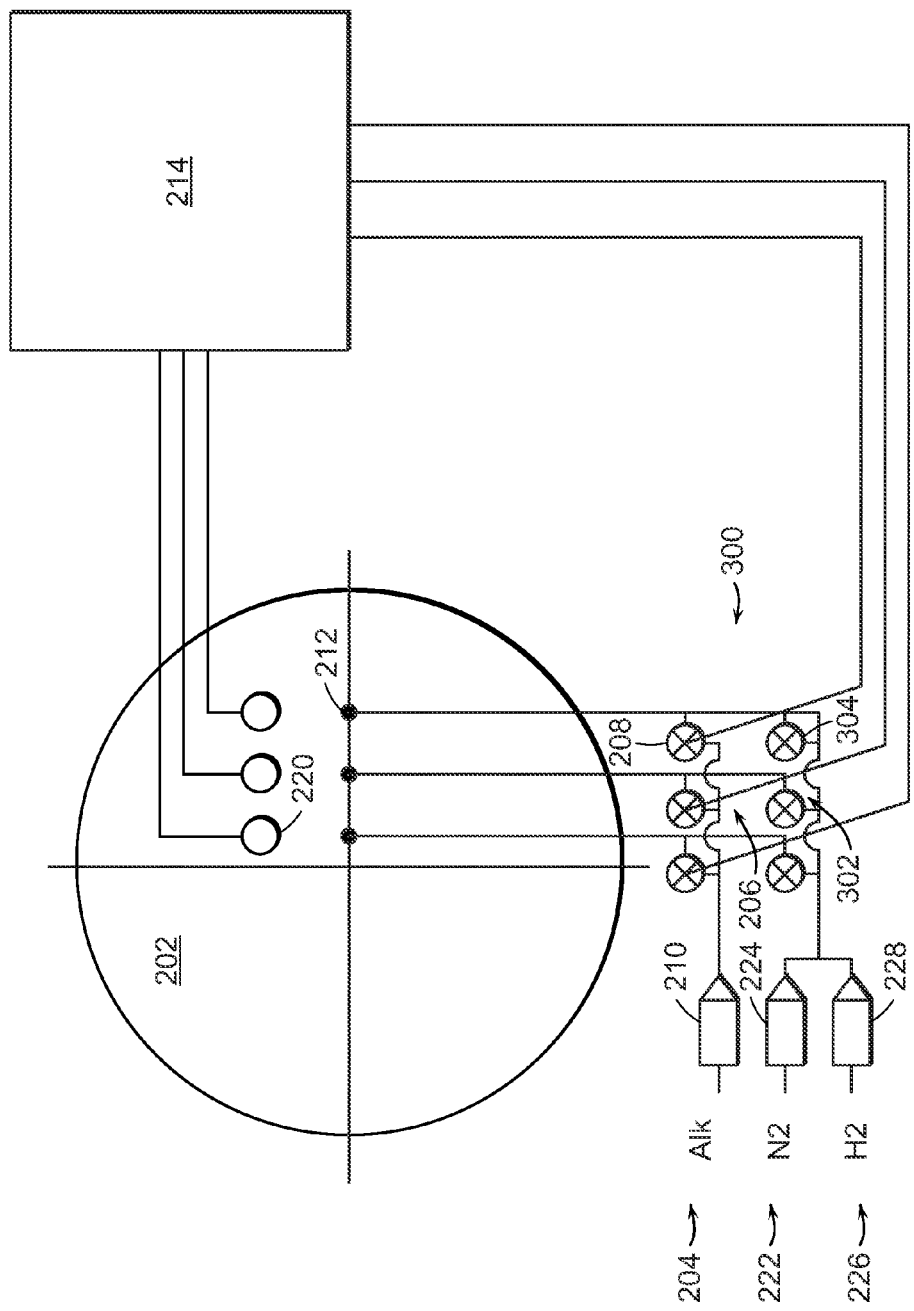
FIG. 3 illustrates a schematic diagram of another multi-zone alkyls injection system 300 according to the present invention for a CVD rotating disc reactor that is similar to the multi-zone alkyls injection system that was described in connection with FIG. 2, but that also includes a second gas manifold comprising a plurality of valves for controlling the flow of the push gasses.

FIG. 3 illustrates a schematic diagram of another multi-zone alkyls injection system 300 according to the present invention for a CVD rotating disc reactor that is similar to the multi-zone alkyls injection system 200 that was described in connection with FIG. 2, but that also includes a second gas manifold 302 comprising a plurality of valves 304 for controlling the flow of the nitrogen and hydrogen push gases. One skilled in the art will appreciate that numerous types of valves can be used. For example, at least some of the plurality of valves 304 in the second gas manifold 302 can be MEMS type valves as described herein. In various embodiments, at least some of the plurality of valves 304 in the second gas manifold 302 are independently controllable. For example, the plurality of valves 304 can be electrically controllable or pneumatically controllable. In some systems and methods of operation, at least one of the plurality of valves 304 is partially or fully open during the entire duration of the process run.

The plurality of gas injectors 212 are coupled to each of the plurality of valves 208 comprising the first gas manifold 208 and also to each of the plurality of valves 304 comprising the second gas manifold 302. In other embodiments, a first plurality of gas injectors is coupled to each of the plurality of valves 208 comprising the first gas manifold 206 and a second plurality of gas injectors is coupled to each of the plurality of valves 304 comprising the second gas manifold 302.

In various embodiments, the diameter of orifices comprising the output of each of the plurality of gas injectors 212 is chosen to correspond to a position of the corresponding valve opening in the gas manifold 302 so that the desired amounts of alkyls and push flow gasses are delivered to the CVD reactor 202.

In another embodiment of the present teaching, separate gas manifolds are used for each push gas source. That is, a second gas manifold comprising a second plurality of valves is coupled to the output to the nitrogen mass flow controller 222 and a third gas manifold comprising a third plurality of valves is coupled to output to the hydrogen mass flow controller 222.

There are numerous possible valve timing sequences that can be used for controlling the opening of the plurality of valves 304. These timing sequences can be the same as or different than the timing sequences used to control the opening of the plurality of valves 208. For example, the timing sequences can be used to provide gas flow velocity matching in some or all of the plurality of zones. Flow velocity matching is important because the areas of the various zones can be significantly different. Also, in some methods according to the present teaching, the timing sequences for opening the plurality of valves 304 are advanced or delayed in time with respect to the timing sequences opening of the plurality of valves 208.

EQUIVALENTS

While the Applicants' teaching are described in conjunction with various embodiments, it is not intended that the Applicants' teaching be limited to such embodiments. On the contrary, the Applicants' teaching encompass various alternatives, modifications, and equivalents, as will be appreciated by those of skill in the art, which may be made therein without departing from the spirit and scope of the teaching.

What is claimed is:

1. A gas injection system for a rotating disk chemical vapor deposition system, the gas injection system comprising:
   a) a gas manifold comprising a plurality of valves, each of the plurality of valves having an input that is coupled to a process gas source and having an output for providing process gas;
   b) a plurality of gas injectors, each of the plurality of gas injectors having an input that is coupled to the output of one of the plurality of valves, and having an output that is positioned in one of a plurality of zones in a chemical vapor deposition reactor;
   c) a controller having a plurality of outputs, each of the plurality of outputs being coupled to a control input of one of the plurality of valves, the controller controlling at least some of the plurality of valves to open and shut with a duty cycle as a function of a rotation rate of the rotating disk CVD reactor and that is chosen to achieve a uniform molar quantity of reactant material across at least a portion of the chemical vapor deposition reactor; and wherein the controller controls at least two of the plurality of valves to open sequentially; and
   d) an in-situ deposition rate monitor that measures at least one of deposition rate or deposited film thickness in at least one of the plurality of zones in the chemical vapor deposition reactor, and having at least one output that is electrically connected to a sensor input of the controller, the controller generating signals that control the duty cycle as a function of the rotation rate and in response to the in-situ growth deposition rate monitor measurements.

2. The gas injection system of claim 1 wherein the gas source comprises an alkyl gas source.

3. The gas injection system of claim 1 wherein at least one of the plurality of valves comprises a MEMS valve.

4. The gas injection system of claim 1 wherein at least one of the plurality of valves comprises an electrically controlled valve.

5. The gas injection system of claim 1 wherein at least one of the plurality of valves comprises a pneumatic controlled valve.

6. The gas injection system of claim 1 wherein a diameter of orifices comprising an output of each of the plurality of gas injectors is the same.

7. The gas injection system of claim 1 wherein a diameter of an orifice comprising an output of at least one of the plurality of gas injectors is different from a diameter of an orifice comprising an output of another one of the plurality of gas injectors.

8. The gas injection system of claim 1 wherein at least one of the plurality of valves is always open during operation.

9. The gas injection system of claim 1 wherein the chemical vapor deposition reactor comprises a rotating disk reactor.

10. The gas injection system of claim 1 wherein the controller generates control signals having a duty cycle for opening at least one of the plurality of valves that is proportional to a radius squared of an aperture of a respective gas injector.

11. The gas injection system of claim 1 wherein a duty cycle for opening at least one of the plurality of valves is longer than one radial rotation of a rotating disk in the rotating disk chemical vapor deposition reactor.

12. The gas injection system of claim 1 wherein a duty cycle for opening at least one of the plurality of valves is an integer multiple of a rotation rate of a rotating disk in the rotating disk chemical vapor deposition reactor.

13. The gas injection system of claim 1 wherein a duty cycle for opening at least one of the plurality of valves enables uniform film thickness at a radial position in the rotating disk chemical vapor deposition reactor.

14. The gas injection system of claim 1 wherein a rotation rate of a rotating disk in the rotating disk chemical vapor deposition reactor is greater than about 120 rpms.

15. The gas injection system of claim 1 wherein at least one of the plurality of gas injector is movable.

16. The gas injection system of claim 1 wherein at least some of the plurality of the injectors are concentrically positioned.

17. The gas injection system of claim 1 further comprising a mass flow controller having an input that is coupled to the process gas source and an output that is coupled to an input of the gas manifold.

* * * * *